(12) United States Patent
Park

(10) Patent No.: US 7,807,322 B2
(45) Date of Patent: Oct. 5, 2010

(54) PHOTOMASK FOR DOUBLE EXPOSURE AND DOUBLE EXPOSURE METHOD USING THE SAME

(75) Inventor: Chan Ha Park, Suwon-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 1028 days.

(21) Appl. No.: 11/317,500

(22) Filed: Dec. 22, 2005

(65) Prior Publication Data

US 2007/0054198 A1 Mar. 8, 2007

(30) Foreign Application Priority Data

Sep. 3, 2005 (KR) .................... 10-2005-0081972

(51) Int. Cl.
G03F 9/00 (2006.01)
G03F 7/22 (2006.01)

(52) U.S. Cl. ........................................ 430/22; 430/394

(58) Field of Classification Search .................... 430/22
See application file for complete search history.

(56) References Cited

U.S. PATENT DOCUMENTS 5,308,741 A 5/1994 Kemp
5,998,068 A * 12/1999 Matsuoka ....................... 430/5
6,335,146 B1 * 1/2002 Noguchi et al. ............. 430/394
6,686,102 B2 2/2004 Randall et al.
6,821,689 B2 11/2004 Pierrat
6,876,439 B2 4/2005 Galburt et al.
6,881,524 B2 4/2005 Cauchi et al.
2005/0105180 A1 * 5/2005 Mackey ....................... 430/311

FOREIGN PATENT DOCUMENTS

KR 10-1997-0049008 7/1997

* cited by examiner

Primary Examiner—Mark F Huff
Assistant Examiner—John Ruggles
(74) Attorney, Agent, or Firm—Townsend and Townsend and Crew LLP

(57) ABSTRACT

A photomask for double exposure, and a double exposure method using the same are disclosed. The photomask for double exposure comprises a mask substrate divided into first and second regions equally arranged to upper and lower sides on different sides, respectively, a first mask pattern formed on the first region of the mask substrate, and a second mask pattern formed on the second region of the mask substrate. The photomask and the double exposure method using the same enable a finer photoresist pattern to be formed on a semiconductor wafer, while minimizing reduction in yield and productivity due to misalignment and replacement.

1 Claim, 7 Drawing Sheets

PHOTOMASK FOR DOUBLE EXPOSURE AND DOUBLE EXPOSURE METHOD USING THE SAME

CROSS-REFERENCES TO RELATED APPLICATIONS

The present application claims priority to Korean Patent Application No. 10-2005-0081972, filed on Sep. 3, 2005, which is incorporated by reference.

BACKGROUND OF THE INVENTION

The present invention relates to a photomask for a double exposure process and a double exposure method using the same which enables a finer photoresist pattern to be formed through the double exposure process while minimizing yield reduction and cycle time due to misalignment of the photomask.

Integrated circuits or "ICs" have evolved from a handful of interconnected devices fabricated on a single chip of silicon to millions of devices. Current ICs provide performance and complexity far beyond what was originally imagined. In order to achieve improvements in complexity and circuit density (i.e., the number of devices capable of being packed onto a given chip area), the size of the smallest device feature, also known as the device "geometry", has become smaller with each generation of ICs.

Photolithography processes are commonly used in the manufacture of integrated circuits to create patterns within layers on a semiconductor wafer. As the complexity and circuit density of integrated circuits gradually increases, it has gradually become increasingly necessary to form patterns having a finer line width and a narrower line-spacing on semiconductor wafers. In order to achieve this task, a photoresist pattern formed in lithography processes is also required to have a finer line width and a narrower line-spacing corresponding to the pattern of the wafer.

However, due to the resolution limit caused by the diffraction of light in photolithography exposure process, it has been difficult to reduce the line width and line-spacing of the photoresist pattern below a certain level via a single exposure process. For this reason, various methods for forming a finer photoresist pattern through a modification in conventional exposure processes have been proposed.

In particular, a double exposure method has been proposed to form a photoresist pattern having a finer line width and a narrower line-spacing on a semiconductor wafer through separate exposure processes.

A conventional double exposure method and problems thereof will be described with reference to FIG. 1, which is a schematic view illustrating a conventional double exposure method.

Referring to FIG. 1, a first photomask 10 which has a first mask pattern 14, such as a first light shielding film pattern or a first phase shift film pattern formed on a first mask substrate 12 is provided. Second photomask 20 which has a second mask pattern 24, such as a second light shielding film pattern or a second phase shift film pattern formed on a second mask substrate 22 is additionally provided.

After first photomask 10 is disposed on a predetermined region of a semiconductor wafer on which a photoresist region to be patterned is formed, a primary exposure process is performed on the predetermined region of the semiconductor wafer using first mask pattern 14 formed on first photomask 10 as a mask.

Then, first photomask 10 is removed, and second photomask 20 is aligned to the predetermined region of the semiconductor wafer initially patterned by the primary exposure process. A secondary exposure process is then performed on the predetermined region of the semiconductor wafer using second mask pattern 24 formed on second photomask 20 as a mask.

First mask pattern 14 of first photomask 10 and second mask pattern 24 of second photomask 20 are formed to possess line widths and line-spacing so that the photoresist pattern can be desirably formed within the resolution limit by the current exposure process. The photoresist patterns corresponding to first mask pattern 14 and second photomask 20, respectively, are desirably formed on the predetermined region of the semiconductor wafer after the primary and secondary exposure processes are completed.

As a result, the photoresist patterns corresponding to first mask pattern 14 and second photomask 20, respectively, are formed together on the predetermined region of the semiconductor wafer processed by the double exposure method so that a photoresist pattern 32 having a very fine line width and line-spacing can be formed on a predetermined region 30 of the semiconductor wafer after the double exposure processes as shown in FIG. 1 (see the third pattern in FIG. 1).

Since the primary and secondary exposure processes are sequentially performed by separately using first photomask 10 and second photomask 20 in separate lithography processes, misalignment of first and second photomasks 10 and 20 can occur during alignment of first photomask 10 or second photomask 20 on the predetermined region of the semiconductor wafer. In this case, photoresist pattern 32 formed on predetermined region 30 of the semiconductor wafer can have an undesired line-spacing due to misalignment, leading to a defective photoresist pattern.

Since such a defective photoresist pattern often results in defective semiconductor devices, defective photoresist patterns are a major factor in the deterioration of yields in the manufacture of semiconductor device. In particular, as the line-spacing of the photoresist pattern on the semiconductor wafer becomes narrower, this problem is greatly exacerbated.

Furthermore, in the conventional double exposure method, other processes such as the removal of first photomask 10 and accurate alignment of second photomask 20 is performed after the primary exposure using first photomask 10 and before the second exposure process is begun, thereby reducing the yield of the double exposure process and the overall efficiency of the semiconductor device manufacturing process.

BRIEF SUMMARY OF THE INVENTION

A photomask for a double exposure process, which enables a finer photoresist pattern to be formed on a semiconductor wafer via a double exposure process while minimizing yield reduction and cycle time due to misalignment of the photomask is provided. A double exposure method using the photomask is also provided.

In a specific embodiment, a photomask for a double exposure process used in the manufacture of integrated circuits is provided. The photomask comprises a mask substrate divided into first and second regions equally arranged on the mask substrate, a first mask pattern formed on the first region of the mask substrate, and a second mask pattern formed on the second region of the mask substrate.

In a specific embodiment, the photomask further comprises a first blocking pattern formed on the first region of the mask substrate and a second blocking pattern formed on the second region of the mask substrate wherein the first mask pattern and the second mask pattern are arranged diagonally to each other.

In a specific embodiment, the photomask further comprises a first blocking pattern formed on the first region of the mask substrate; and a second blocking pattern formed on the second region of the mask substrate, wherein the first blocking pattern and second blocking pattern are adjacent to each other.

In a specific embodiment, a method for performing a double exposure lithography process used in the manufacture of integrated circuits is provided. The method comprises providing a photomask, the photomask being arranged to move in first and second directions, the first and second directions being in the plane of a semiconductor wafer to be formed with a photoresist pattern thereon. A first region of the photomask is then aligned to a predetermined region of the semiconductor wafer, and a primary exposure process is performed on the predetermined region of the semiconductor wafer using a first mask pattern formed on the first region of the photomask. The photomask is then moved in the first direction so as to allow a second region of the photomask to be aligned to the predetermined region of the semiconductor wafer, and a secondary exposure process is performed on the predetermined region of the semiconductor wafer using a second mask pattern formed on the second region of the photomask.

In a specific embodiment, the first direction is in an y-direction and the second direction is in a x-direction, the x- and y-directions located in the plane of the wafer.

In a specific embodiment, the first direction is in an x-direction and the second direction is in a y-direction, the x and y directions located in the plane of the wafer.

In a specific embodiment, the primary and secondary exposure processes are performed by non-polarized light through an annular illuminating system.

In a specific embodiment, the first and second mask patterns are arranged in third and fourth directions, respectively, and during the primary exposure process, the predetermined region of the semiconductor wafer is exposed to light polarized in the third direction, and during the secondary exposure process, the predetermined region of the semiconductor wafer is exposed to light polarized in the fourth direction.

In a specific embodiment, the first direction is perpendicular to the second direction.

In a specific embodiment, the first and second directions correspond respectively with the first and second mask patterns.

In a specific embodiment a photomask for a double exposure process used in the manufacture of integrated circuits is provided. The photomask comprises a mask substrate divided into first and second regions equally arranged on the mask substrate, a first mask pattern formed on the first and second regions of the mask substrate in a first direction, and a second mask pattern formed on the first and second regions of the mask substrate in a second direction different from the first direction.

In a specific embodiment, the first mask pattern and the second mask pattern are adjacent to each other in the first region of the mask substrate; and the first mask pattern and the second mask pattern are adjacent to each other in the second region of the mask substrate.

In a specific embodiment, the second mask pattern on the first region of the mask substrate is adjacent to the first mask pattern on the second region of the mask substrate.

In a specific embodiment, a method for performing a double exposure lithography process used in the manufacture of integrated circuits is provided. The method comprises providing a photomask, the photomask being arranged to move in first and second directions, the first and second directions being in the plane of a semiconductor wafer to be formed with a photoresist pattern thereon. A first region of the photomask is then aligned to a predetermined region of the semiconductor wafer and a primary exposure process is performed to allow the predetermined region of the semiconductor wafer to be exposed to light polarized in a third direction using first mask pattern formed on the first region of the photomask. The photomask is then moved in the first direction so as to allow a second region of the photomask to be aligned to the predetermined region of the semiconductor wafer; and a secondary exposure process is performed to allow the predetermined region of the semiconductor wafer to be exposed to light polarized in a fourth direction different from the first direction using second mask pattern formed on the second region of the photomask.

In a specific embodiment, the first direction is perpendicular to the second direction.

In a specific embodiment, the first direction is in an y-direction and the second direction is in a x-direction, the x and y directions located in the plane of the wafer.

In a specific embodiment, the first direction is in an x-direction and the second direction is in a y-direction, the x and y directions located in the plane of the wafer.

In a specific embodiment, the method according to claim 14 wherein the first and third directions are the same directions and the second and fourth directions are the same directions.

DETAILED DESCRIPTION OF THE INVENTION

Exemplary embodiments of the present invention will be described in detail with reference to the accompanying drawings.

A photomask for a double exposure process and a double exposure method using the same according to an embodiment of the invention will be described with reference to the drawings such that those skilled in the art may practice the present invention according to the teachings of the description.

Figure 2:
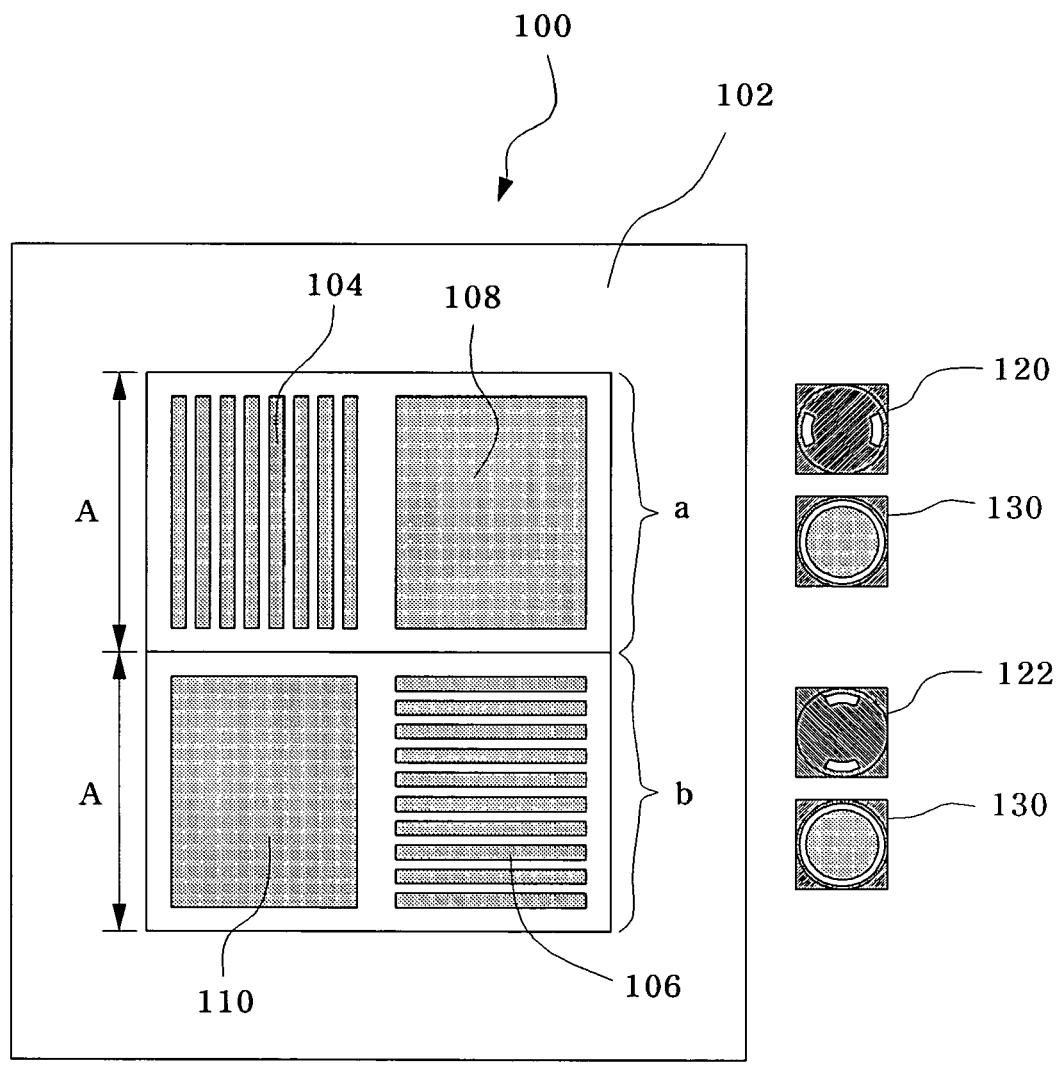
FIGS. 2-5 are exemplary simplified schematic views illustrating photomasks used in a double exposure process in accordance with a specific embodiment of the present invention.
Figure 4:
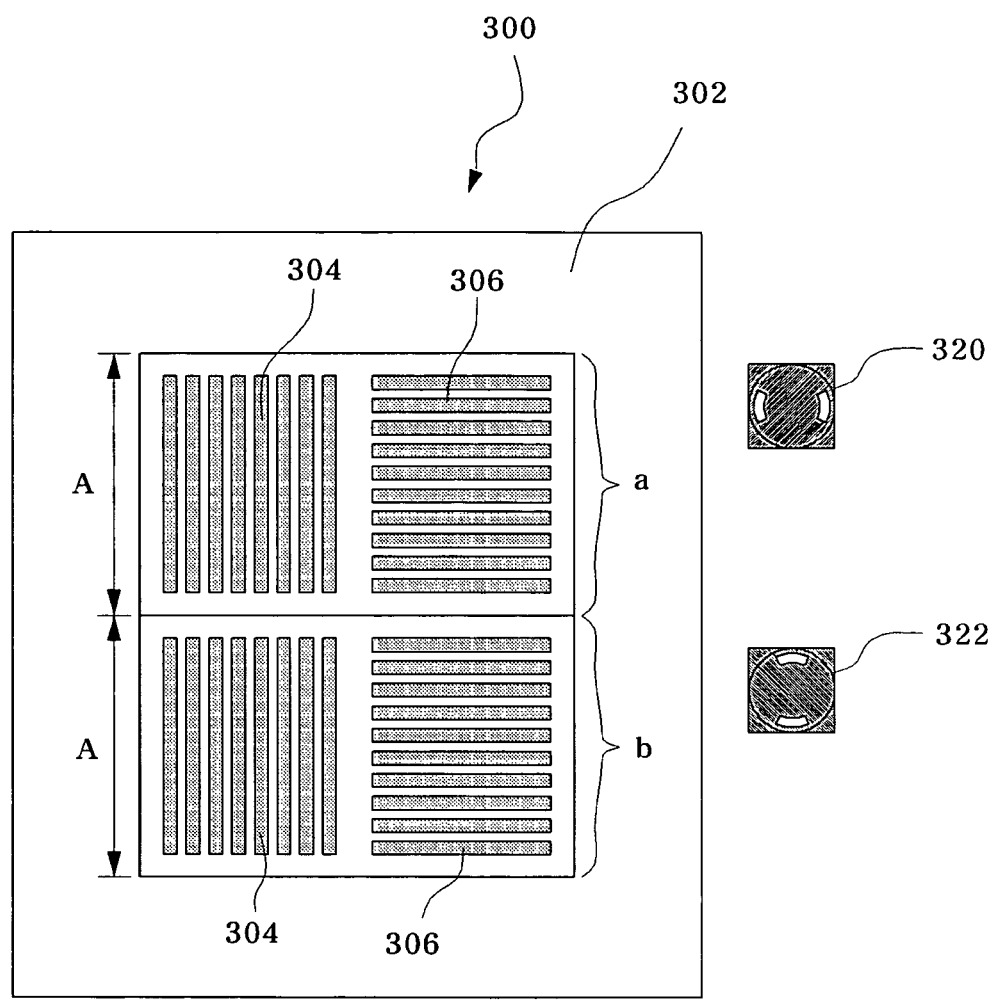
Figure 4:
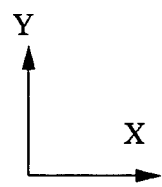
Figure 5:
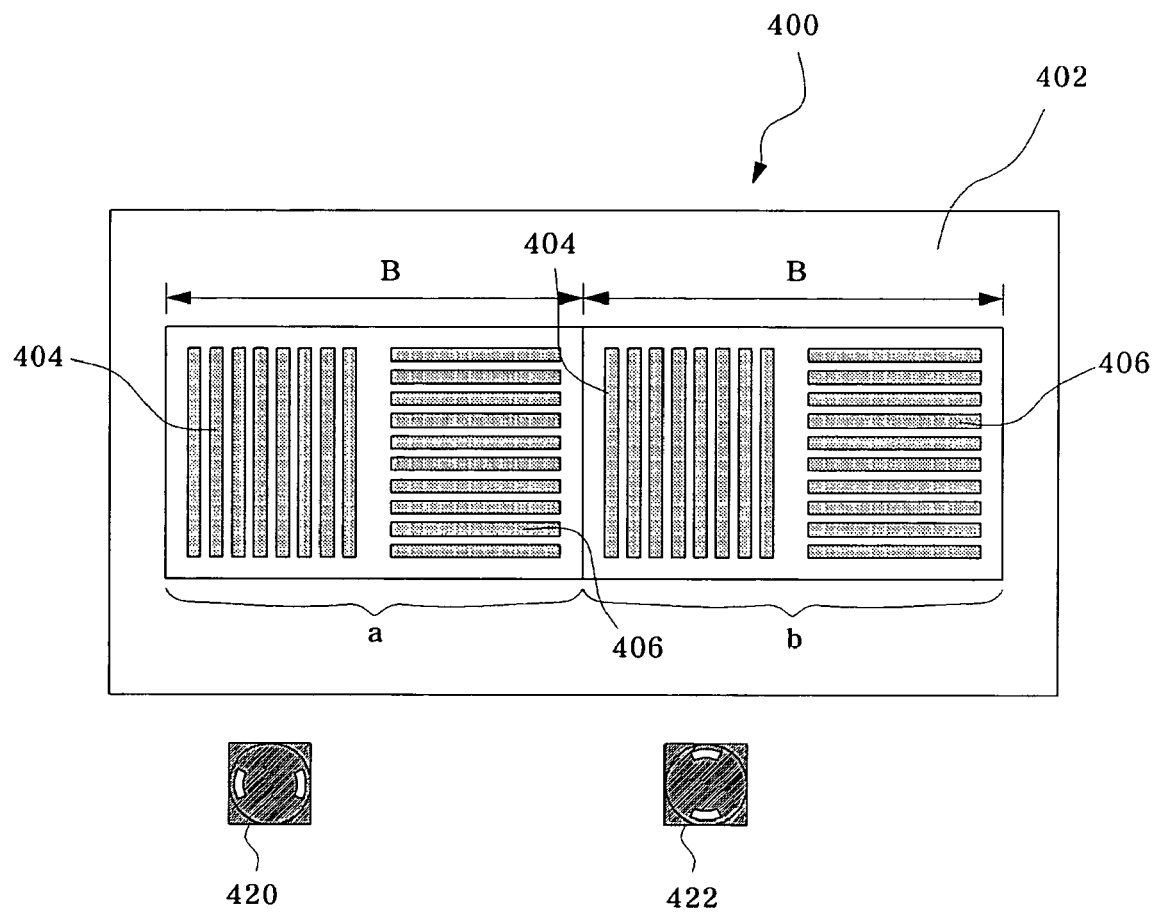
Figure 6:
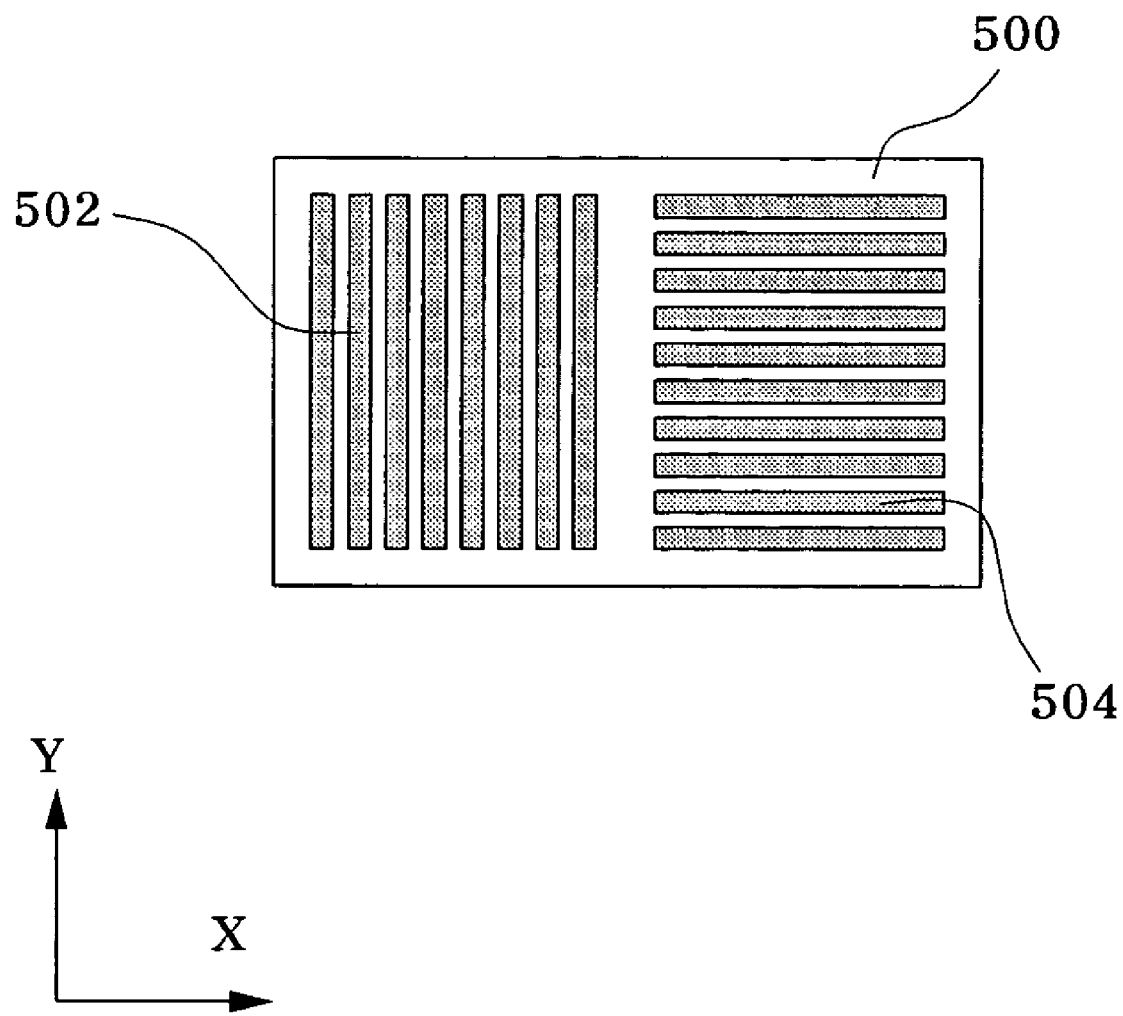
FIG. 6 is an exemplary simplified schematic view illustrating a photoresist pattern formed on a semiconductor wafer after a double exposure process using the photomasks of FIGS. 2-5 has been performed.

FIG. 2 is an exemplary simplified schematic view illustrating a photomask for a double exposure process in accordance with a specific embodiment of the invention, and FIG. 6 is an exemplary simplified schematic view illustrating a photoresist pattern formed on a semiconductor wafer after a double exposure process has been performed using the photomasks of FIGS. 2 to 5.

Referring to FIG. 2, a photomask 100 used in a double exposure process is provided, with photomask 100 being arranged to move in first and second directions. The first and second directions are in the plane of the semiconductor wafer where a photoresist pattern is to be formed on the wafer. Photomask 100 comprises a mask substrate 102 divided into first and second regions "a" and "b", which are equally arranged on different sides of the photomask and have a substantially identical height "A".

First region "a" of mask substrate 102 is formed with a first mask pattern 104, for example, a first light shielding film pattern composed of a light shielding material such as Cr, or a first phase shift film pattern comprised of a Mo-based phase shift material. Blocking pattern 108 is additionally formed on first region "a" adjacent to first mask pattern 104. Blocking pattern 108 may be formed from a non-transmissive material such as a light shielding material such as Cr, or a first phase shift film pattern comprised of a Mo-based phase shift material.

Second region "b" of mask substrate 102 is formed with a second mask pattern 106, for example, a second light shielding film pattern composed of the light shielding material such as Cr, or a second phase shift film pattern comprised of the Mo-based phase shift material. Second mask pattern 106 is arranged diagonally from first mask pattern 104. Blocking pattern 110 is additionally formed on second region "b" adjacent to second mask pattern 106. Blocking pattern 110 may be formed from a non-transmissive material such as a light shielding material such as Cr, or a first phase shift film pattern comprised of a Mo-based phase shift material.

Depending on the structure of first and second masks patterns 104 and 106, photomask 100 can be any kind of photomask including a binary mask, a phase shift mask, and the like. Except for the specific features described above, the photomask of the first embodiment has a typical structure well known in the art, and further detailed description of the photomask will be omitted.

The double exposure method using photomask 100 according to a specific embodiment will be described in detail as follows.

First, photomask 100 according to a specific embodiment is provided with the photomask being arranged to move in first and second directions. The first and second directions are in the plane of the semiconductor wafer where a photoresist pattern is to be formed on the wafer. First region "a" of photomask 100 is then aligned to a predetermined region of a semiconductor wafer on which a photoresist to be patterned is formed.

Then, a primary exposure process is performed on the predetermined region of the semiconductor wafer using first mask pattern 104 formed on first region "a" of photomask 100.

Next, photomask 100 is moved in a y-direction so as to allow second region "b" of photomask 100 to be aligned to the predetermined region of the semiconductor wafer processed by the primary exposure process. In a specific embodiment, photomask 100 is moved by a height "A" of first region "a" in a y-direction such that second region "b" of photomask 100 is aligned to the predetermined region of the semiconductor wafer where first region "a" of photomask 100 is disposed during the primary exposure.

Next, a secondary exposure process is performed for the predetermined region of the semiconductor wafer using second mask pattern 106 formed on second region "b" of photomask 100 as a mask.

After the double exposure processes have been completed, FIG. 6 shows photoresist patterns 502 and 504 corresponding to first and second mask patterns 104 and 106, respectively formed on a predetermined region 500 of the semiconductor wafer processed by the double exposure method. Both first and second mask patterns 104 and 106 are formed to a line width and a line-spacing within a resolution limit by the current exposure process, enabling the photoresist patterns to be formed. As a result, without problems caused by diffraction of light and the like, photoresist patterns 502 and 504 corresponding to first and second mask patterns 104 and 106, respectively, are formed on predetermined region 500 of the semiconductor wafer.

In a specific embodiment, photoresist patterns 502 and 504 corresponding respectively to first and second mask patterns 104 and 106, are formed together on predetermined region 500 of the semiconductor wafer so that photoresist patterns 502 and 504 having an ultra fine line width and line-spacing are formed on predetermined region 500 of the semiconductor wafer processed by the double exposure method.

By using the photomask for the double exposure process and the double exposure method described in a specific embodiment, first and second mask patterns 104 and 106 are formed together on single photomask 100, thereby eliminating a process for replacing photomask 100, and other accompanying processes required when two photomasks are used. As a result, yield reduction and cycle time are minimized due to misalignment of the photomask and the productivity of the double exposure process and of a semiconductor manufacturing method comprising the double exposure process are enhanced.

Furthermore, since first and second mask patterns 104 and 106 are formed on single photomask 100, there is no need for precise alignment of the two photomasks through separate alignment processes as in the conventional exposure process. Instead, after moving photomask 100 by height "A" of first region "a" in a y-direction, the secondary exposure is performed, thereby eliminating the process of aligning and disposing the photomask. Accordingly, there is less possibility of misalignment of the photomask between the primary exposure and the secondary exposure, thereby minimizing defective photoresist patterns and preventing reduction in yield due to misalignment of the photomask.

Meanwhile, for the double exposure method according to a specific embodiment, the primary and secondary exposures can be performed in a specific embodiment by non-polarized light through an annular illuminating system 130 or light polarized in a predetermined direction through dipole illuminating systems 120 and 122 as a light source.

In a specific embodiment, if a desired photoresist pattern has a denser line-spacing and a more uniform size, it is preferable that the primary and secondary exposure processes be performed using the light polarized in the predetermined direction.

More specifically, if first mask pattern 104 and second mask pattern 106 are arranged respectively in a first direction (in the y-direction of FIG. 2) and in a second direction (in the x-direction of FIG. 2), the primary exposure process is performed such that the predetermined region of the semiconductor wafer can be exposed to light polarized in the first direction through a dipole X illuminating system 120 which acts to polarize light in the first direction (in the y-direction of FIG. 2), and the secondary exposure process is performed such that the predetermined region of the semiconductor wafer can be exposed to light polarized in the second direction through a dipole Y illuminating system 122 which acts to polarize light in the second direction (in the x-direction of FIG. 2). With the structure described above, the photoresist pattern having a denser line-spacing and a more uniform size can be desirably formed with higher resolution.

Figure 1:
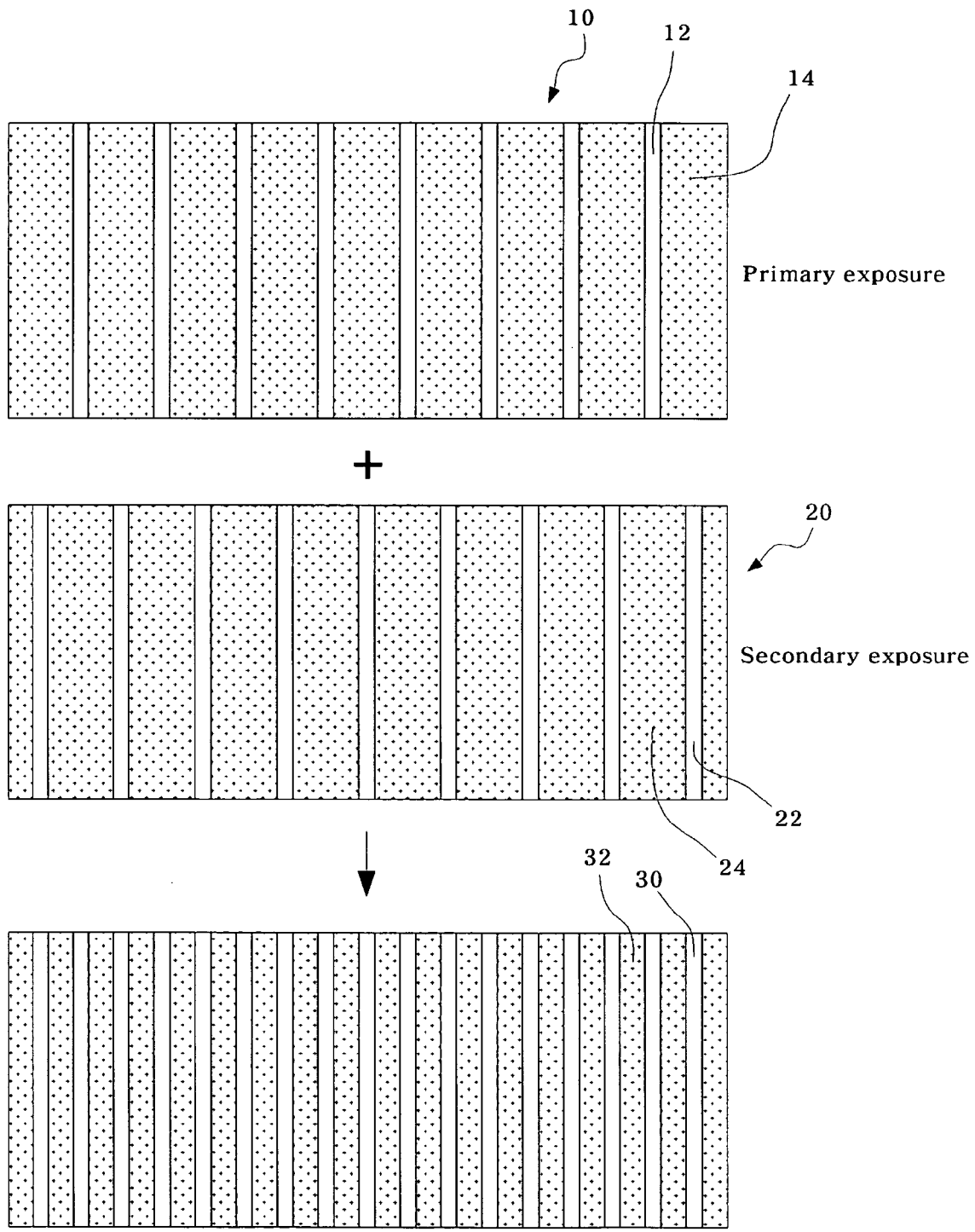
FIG. 1 is an exemplary simplified schematic view illustrating a conventional double exposure method.

It has been described in a specific embodiment that first and second mask patterns 104 and 106 are arranged in the y- and x-directions, respectively, thereby allowing photoresist patterns 502 and 504 arranged perpendicular to each other to be formed on predetermined region 500 of the semiconductor wafer through the double exposure method. However, it should be apparent to those skilled in the art that a photoresist pattern having a line & space shape as shown in FIG. 1 or other shapes can be formed to a denser line-spacing and a finer line width through the photomask for a double exposure process and the double exposure method according to an embodiment of the invention.

A photomask for a double exposure process and a double exposure method using the same according to an embodiment of the invention will be described with reference to drawings such that those skilled in the art can easily practice the present invention according to the teachings of the description.

Figure 3:
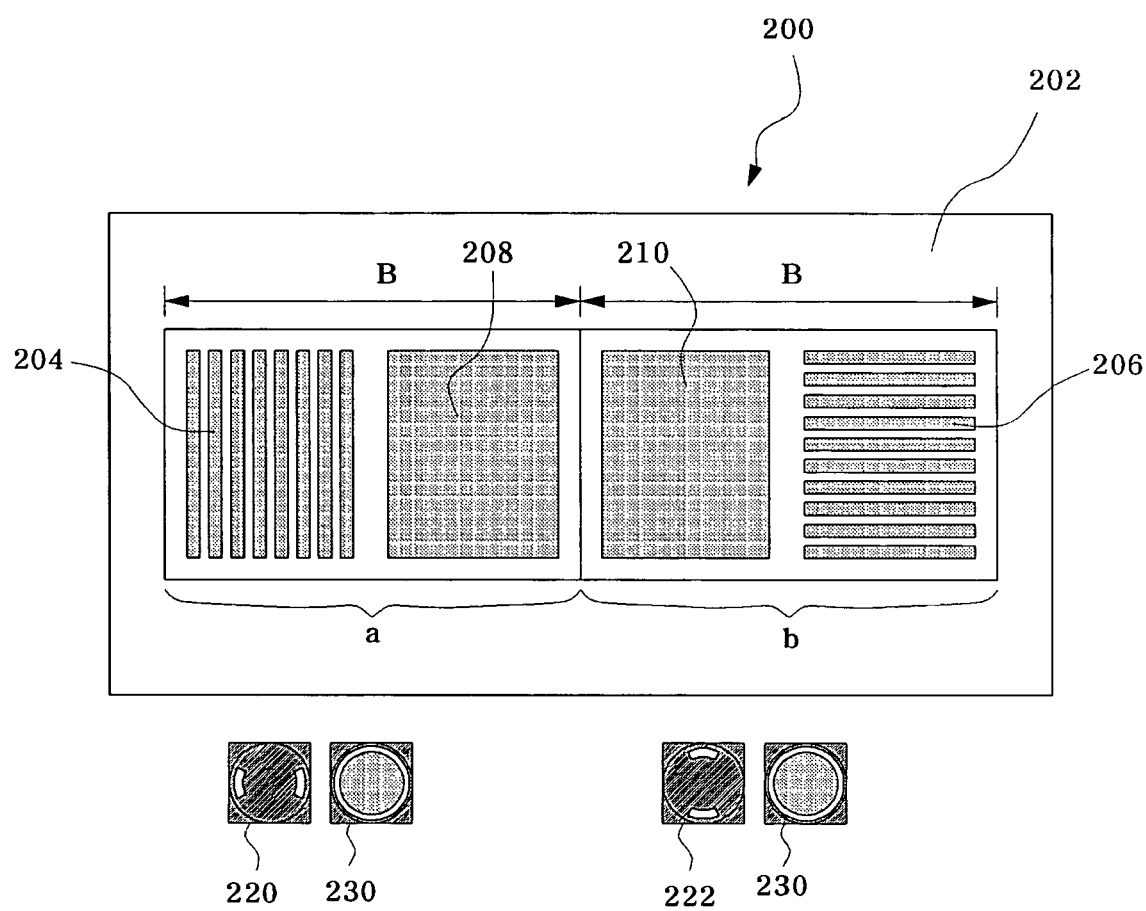

FIG. 3 is an exemplary simplified schematic view illustrating a photomask for a double exposure process in accordance with a specific embodiment of the invention, and FIG. 6 is an exemplary simplified schematic view illustrating a photoresist pattern formed on the semiconductor wafer after a double exposure process has been performed using the photomasks of FIGS. 2 to 5.

Referring to FIG. 3, a photomask 200 described in this specific embodiment is similar to the photomasks of previous embodiments. Exceptionally, photomask 200 of the embodiment is different from the photomask of previous embodiments in that first and second regions "a" and "b" are uniformly disposed on different sides in the x-direction of mask substrate 202. In other words, photomask 200 according to the present embodiment comprises a mask substrate 202 divided into first and second regions "a" and "b" having a substantially identical width "B" while being equally arranged to the left and right sides, respectively.

In a specific embodiment, photomask 200 used in a double exposure process is provided, with photomask 200 being arranged to move in first and second directions. The first and second direction are in the plane of the semiconductor wafer where a photoresist pattern is to be formed on the wafer. Photomask 200 comprises a first mask pattern 204, for example, a first light shielding film pattern or a first phase shift film pattern, formed on first region "a" of mask substrate 202, and a second mask pattern 206, for example, a second light shielding film pattern or a second phase shift film pattern, formed on second region "b" of mask substrate 202.

Next, the double exposure method using photomask 200 will be described in detail as follows. The double exposure method according to this specific embodiment is similar to the methods described in previous embodiments. However, for the double exposure method according to the specific embodiment, photomask 200 is moved by width "B" of first region "a" in the x-direction after a primary exposure so as to allow second region "b" of photomask 200 to be aligned to the predetermined region of the semiconductor wafer at the substantially same position where first region "a" of photomask 200 is aligned to during a primary exposure process. The secondary exposure process is then performed to form photoresist patterns 502 and 504, respectively, corresponding to first and second mask patterns 204 and 206 together on predetermined region 500 of the semiconductor wafer processed by the double exposure method. As a result, photoresist patterns 502 and 504 having an ultra fine line width and line-spacing can be formed on predetermined region 500 of the semiconductor wafer processed by the double exposure process. In a specific embodiment, the order of the primary and secondary exposures can be switched, with the moving of the mask being performed in the opposite x-direction.

By using the photomask for the double exposure process and the double exposure method according to a specific embodiment, first and second mask patterns 204 and 206 are formed together on single photomask 200. Accordingly, a process for replacing photomask 200 and other accompanying processes required when two photomasks are used can be eliminated. At the same time, there is no need for precise alignment of two photomasks through separate alignment processes as in the conventional exposure process. Instead, after moving photomask 200 by width "B" of first region "a" in the x-direction, the secondary exposure process is directly performed, thereby eliminating the process of separately aligning the photomask. In addition, there is a reduced possibility of misalignment of the photomask between the primary exposure and secondary exposure processes, thereby minimizing the amount of defective photoresist patterns and reduction in yield due to misalignment of the photomask.

In a specific embodiment, the primary and secondary exposures can also be performed by non-polarized light through annular illuminating system 230 or by light polarized in a predetermined direction through dipole illuminating systems 220 and 222 as a light source.

More specifically, when the light polarized in the predetermined direction is used as the light source, if first mask pattern 204 and second mask pattern 206 are arranged, for example, in a first direction (in the y-direction of FIG. 3) and in a second direction (in the x-direction of FIG. 3), respectively, as shown in FIG. 3, the primary exposure process is performed such that the predetermined region of the semiconductor wafer can be exposed to light polarized in the first direction through dipole X illuminating system 220 which acts to polarize light in the first direction (in the y-direction of FIG. 3), and the secondary exposure is performed such that the predetermined region of the semiconductor wafer can be exposed to light polarized in the second direction through dipole Y illuminating system 222 which acts to polarize light in the second direction (in the x-direction of FIG. 3). With the structure described above, the photoresist patterns having a denser line-spacing and a more uniform size can be formed with higher resolution.

In addition, it has been described in an embodiment that photoresist patterns 502 and 504 are arranged perpendicular to each other on predetermined region 500 of the semiconductor wafer through the double exposure method. However, it would be appreciated by those skilled in the art that a photoresist pattern having a line-space shape as shown in FIG. 1 or other shapes can be formed with a denser line-spacing and finer line width through the photomask for used in a double exposure process and the double exposure method according to a specific embodiment.

A photomask for a double exposure process and a double exposure method using the same according to an embodiment of the invention will be described with reference to drawings such that those skilled in the art practice the present invention according to the teachings of the description.

FIG. 4 is an exemplary schematic view illustrating a photomask for a double exposure process in accordance with an embodiment of the present invention and FIG. 6 is an exemplary schematic view illustrating the photoresist pattern formed on the semiconductor wafer after a double exposure process has been performed using the photomasks of FIGS. 2 to 5, and FIG. 7 is an exemplary simplified view illustrating a photoresist pattern arranged in the direction after exposure with light polarized in the vertical direction by a KrF dipole X illuminating system.

Referring to FIG. 4, photomask 300 as described in this specific embodiment has a mask substrate 302 divided into first and second regions "a" and "b", which are equally arranged on different sides in the y-direction, respectively, and have a substantially identical width "A". First region "a" of mask substrate 302 is formed with a first mask pattern 304, for example, a first light shielding film pattern composed of a light shielding material such as Cr, or a first phase shift film pattern comprised of a Mo-based phase shift material, and with a second mask pattern 306, for example, a second light shielding film pattern composed of the light shielding material such as Cr, or a second phase shift film pattern comprised of the Mo-based phase shift material. First and second mask patterns 304 and 306 are also formed on second region "b" of mask substrate 302 as on first region "a" of mask substrate 302.

First mask pattern 304 is arranged in a first direction (in the y-direction of FIG. 4) and second mask pattern 306 in a second direction (in the x-direction of FIG. 4), in which the first direction is different from the second direction. As will be more specifically described hereinafter, when the first mask pattern 304 and second mask pattern 306 are arranged in the same direction, both first and second mask patterns 304 and 306 are resolved in each of the primary and secondary exposures even with the light polarized in a predetermined direction as the light source. Unlike the first and second embodiments, photomask 300 according to a specific embodiment can be used only for forming two photoresist patterns arranged in different directions. Thus, photomask 300 according to a specific embodiment cannot be used for forming a single photoresist pattern arranged in one direction, for example, the photoresist pattern having a line-spacing formation with finer line-spacing and line width as shown in FIG. 1.

Depending on the structure of the first and second mask patterns 304 and 306, photomask 300 of this specific embodiment can be any kind of photomask including a binary mask, a phase shift mask, and the like. Next, the double exposure method using photomask 300 according to a specific embodiment will be described in detail as follows.

First, photomask 300 according to a specific embodiment is provided, with photomask 300 being arranged to move in first and second directions. The first and second directions are in the plane of the semiconductor wafer where a photoresist pattern is to be formed on the wafer. First region "a" of photomask 300 is then aligned on a predetermined region of a semiconductor wafer on which the photoresist region to be patterned is formed.

Then, a primary exposure process is performed for the predetermined region of the semiconductor wafer through first mask pattern 304 formed on first region "a" of photomask 300, with light polarized, for example, through dipole X illuminating system 320 in the first direction (in the Y-direction of FIG. 4) the same as the direction of arranging the first mask pattern 304.

Figure 7:
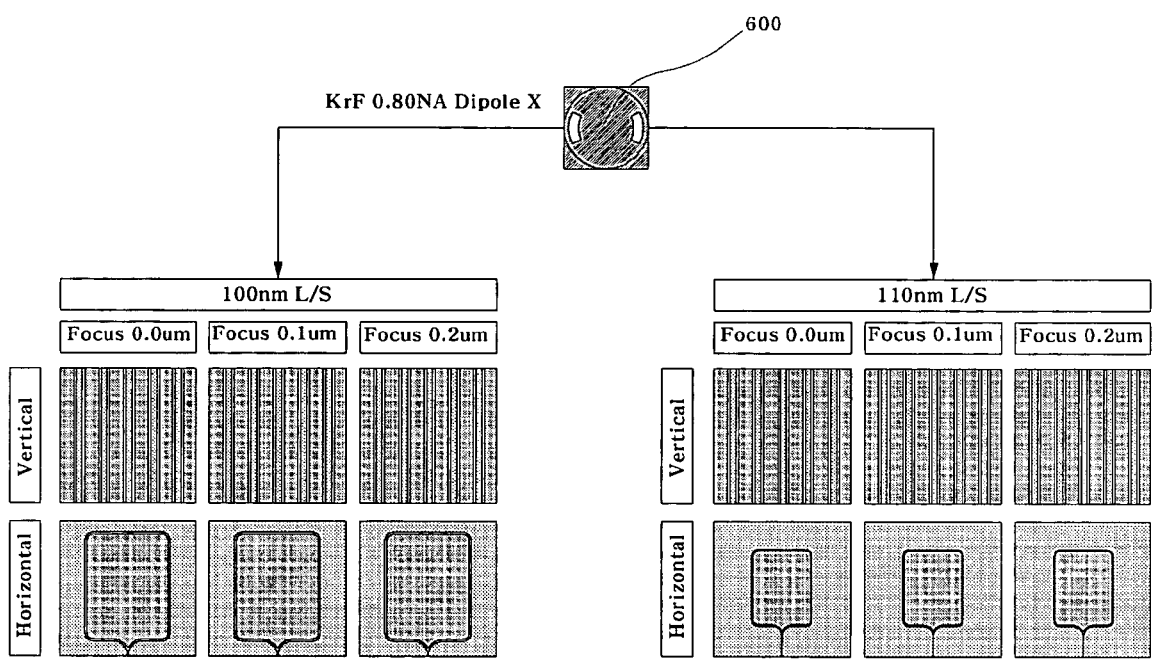
FIG. 7 is an exemplary simplified view illustrating a photoresist pattern arranged in the vertical and horizontal directions after exposure with light polarized in the vertical direction by a KrF dipole X illuminating system.

Referring to FIG. 7, when forming a photoresist pattern of a 1:1 line & space shape, for example, through a KrF 0.80NA dipole X 35 degree illuminating system 600, the light is polarized in the vertical or Y-direction. As a result, the mask pattern arranged in the vertical direction can be resolved by the polarized light to form the photoresist pattern corresponding to the mask pattern, whereas the mask pattern arranged in the horizontal or X-direction cannot be resolved by the polarized light due to lack of resolution, failing to form the photoresist pattern corresponding to the mask pattern.

Thus, after the primary exposure, only first mask pattern 304 arranged in the same direction as the polarized direction of the light is resolved by the light polarized in the first direction (in the Y-direction of FIG. 4). Only photoresist pattern 502 corresponding to first mask pattern 304 is formed on a predetermined region 500 of the semiconductor wafer processed by the primary exposure process (see FIG. 6).

After the primary exposure process, photomask 300 is moved in the y-direction so as to allow second region "b" of photomask 300 to be arranged and disposed on the predetermined region of the semiconductor wafer. In a specific embodiment, photomask 300 is moved by a height "A" of first region "a" in the Y-direction such that second region "b" of photomask 300 is aligned to the predetermined region of the semiconductor wafer where first region "a" of photomask 300 is aligned to during the primary exposure.

Next, a secondary exposure process is performed for the predetermined region of the semiconductor wafer through second mask pattern 306 formed on second region "b" of photomask 300. In a specific embodiment, polarized light is sent through the dipole Y illuminating system 322 in the second direction (in the x-direction of FIG. 4), the same as the direction in which second mask pattern 306 is arranged.

As in the primary exposure process, after the secondary exposure process has been performed, only second mask pattern 306 arranged in the same direction as the polarized direction of the light is resolved by the light polarized in the second direction (in the x-direction of FIG. 4), so that only photoresist pattern 504 corresponding to second mask pattern 306 is formed on predetermined region 500 of the semiconductor wafer processed by the secondary exposure process (see FIG. 6).

By using the light polarized in the same directions in which first and second mask patterns 304 and 306 are respectively arranged as the light source in the primary and secondary exposure processes, photoresist pattern 502 corresponding to first mask pattern 304 is selectively formed on the predetermined region 500 of the semiconductor wafer during the primary exposure process and photoresist pattern 504 corresponding to second mask pattern 306 is selectively formed on predetermined region 500 of the semiconductor wafer during the secondary exposure process (see FIG. 6).

Since both first and second mask patterns 304 and 306 are formed with a line width and a line-spacing which enable the photoresist patterns to be formed within the resolution limit by the current exposure process, photoresist patterns 502 and 504 corresponding to first and second mask patterns 304 and 306 are desirably formed together on predetermined region 500 of the semiconductor wafer through the double exposure process described above without problems caused by diffraction of light. As a result, as shown in FIG. 6, photoresist patterns 502 and 504 having an ultra fine line width and line-spacing can be formed on predetermined region 500 of the semiconductor wafer processed by the double exposure process.

With the photomask for the double exposure process and the double exposure method according to a specific embodiment, since first and second mask patterns 304 and 306 are formed together on single photomask 300, there is no need for precise alignment of two photomasks through separate alignment processes as in the conventional exposure process. Instead, after moving photomask 300 by a height "A" of first region "a" in the y-direction, the secondary exposure is directly performed, thereby eliminating the process of aligning and disposing the photomask. In addition, there is less possibility of misalignment of the photomask between the primary and secondary exposure processes, thereby minimizing defective photoresist patterns and reduction in yield of the semiconductor manufacturing process due to misalignment of the photomask.

Although it has been described that, with first and second mask patterns 304 and 306 arranged in the vertical and horizontal directions, photoresist patterns 502 and 504 are formed perpendicular to each other on predetermined region 500 of the semiconductor wafer through the double exposure method, it will also be apparent to those skilled in the art that a photoresist pattern having various shapes can be formed thereon.

A photomask for a double exposure process and a double exposure method using the same according to a specific embodiment of the invention will be described with reference to drawings such that those skilled in the art can practice the present invention according to the teachings of the description. FIG. 5 is an exemplary simplified schematic view illustrating a photomask for a double exposure process in accordance with a specific embodiment of the present invention, and FIG. 6 is an exemplary simplified schematic view illustrating the photoresist pattern formed on the semiconductor wafer after a double exposure process has been performed using the photomasks of FIGS. 2 to 5.

Referring to FIG. 5, a photomask 400 according to this specific embodiment is substantially the same as photomasks used in other embodiments. Photomask 400 differs, in part, in that first and second regions "a" and "b" are equally disposed on different sides in the x-direction of mask substrate 102. When viewing the mask in a top-down view, the masks are arranged side-to-side with section "a" to the left and section "b" to the right. In other words, photomask 400 according to a specific embodiment comprises a mask substrate 402 divided into first and second regions "a" and "b" having the same width "B" while being equally arranged to the left and right sides, respectively.

Photomask 400 is similar to photomasks of other embodiments in that first region "a" of mask substrate 302 is formed with a first mask pattern 404, for example, a first light shielding film pattern or a first phase shift film pattern, and with a second mask pattern 406, for example, a second light shielding film pattern or a second phase shift film pattern First and second mask patterns 404 and 406 are also formed on second region "b" of mask substrate 402.

In addition first mask pattern 404 and second mask pattern 406 are also arranged in a first direction (in the y-direction of FIG. 5) and in a second direction (in the x-direction of FIG. 5), respectively, in which the first direction is different from the second direction.

Next, the double exposure method using photomask 400 will be described in detail as follows. The double exposure method according to this specific embodiment is similar to the methods described in previous embodiments. However, for the double exposure method according to this specific embodiment, photomask 400 is moved by a width "B" of first region "a" in the x-direction after a primary exposure so as to allow second region "b" of photomask 400 to be aligned to the predetermined region of the semiconductor wafer at the same position where first region "a" of photomask 400 is aligned to during the primary exposure process.

The secondary exposure process is then performed to allow photoresist patterns 502 and 504 respectively corresponding to first and second mask patterns 404 and 406 to be formed together on a predetermined region 500 of the semiconductor wafer processed by the double exposure process. As a result, photoresist patterns 502 and 504 having an ultra fine line width and line-spacing can be formed on predetermined region 500 of the semiconductor wafer processed by the double exposure process. In a specific embodiment, the order of the primary and secondary exposures can be switched, with the moving of the mask being performed in the opposite x-direction.

By using the photomask for the double exposure process and the double exposure method according to a specific embodiment, first and second mask patterns 404 and 406 are formed together on single photomask 400. Accordingly a process for replacing photomask 400, and other accompanying processes can be eliminated. At the same time, there is no need for precise alignment of the two photomasks through separate alignment processes as in the conventional exposure process. Instead, after moving photomask 400 by the width "B" of the first region "a" in the x-direction, the secondary exposure is directly performed, thereby eliminating the process of separately aligning and disposing the photomask. In addition, there is a reduced possibility of misalignment of the photomask between the primary exposure and the secondary exposure processes, thereby minimizing the amount of defective photoresist patterns and preventing reduction in yield due to misalignment of the photomask.

In a specific embodiment, photoresist patterns 502 and 504 can be formed not only perpendicular to each other but also in various shapes on predetermined region 500 of the semiconductor wafer through the double exposure method. As apparent from the above description, according to the present invention, the photomask and the double exposure method using the same enable a finer photoresist pattern to be formed while minimizing yield reduction and cycle time due to misalignment of the photomask.

Accordingly, the photomask and the double exposure method remarkably enhance a degree of integration, high fineness, and yield of semiconductor devices.

It should be understood that the embodiments and the accompanying drawings have been described for illustrative purposes. Further, those skilled in the art will appreciate that various modifications, additions and substitutions are allowed without departing from the scope and spirit of the invention as set forth in the accompanying claims.

What is claimed is:

1. A method for performing a double exposure lithography process comprising:

providing a photomask having a first region on which first mask patterns formed to be vertical line patterns are arranged offset from each other along an x-direction and a second region on which second mask patterns formed to be horizontal line patterns are arranged offset from each other along a y-direction;

aligning the first region of the photomask to cover a predetermined region of a substrate;

performing a first exposure process to expose the predetermined region of the substrate with dipole X illumination to expose the first mask patterns:

moving the photomask to align the second region of the photomask to cover the entire predetermined region of the substrate, wherein the photomask is moved such that the second mask patterns are not overlapped on the exposed first mask patterns; and performing a second exposure process to expose the predetermined region of the substrate with dipole Y illumination to expose the second mask patterns, wherein first photoresist patterns corresponding to the first mask patterns and second photoresist patterns corresponding to the second mask patterns are respectively formed on the predetermined region of the substrate by the first and second exposure processes.

* * * * *